United States Patent [19]

Takagi

[11] Patent Number: 5,912,577

[45] Date of Patent: Jun. 15, 1999

[54] LEVEL SHIFT CIRCUIT

[75] Inventor: Shunsuke Takagi, Kanagawa, Japan

[73] Assignee: Sony Corporation, Japan

[21] Appl. No.: 09/012,426

[22] Filed: Jan. 23, 1998

[30] Foreign Application Priority Data

Jan. 27, 1997 [JP] Japan .................................. 9-012332

[51] Int. Cl.$^6$ ...................................................... H03L 5/00
[52] U.S. Cl. .......................... 327/333; 327/112; 327/376; 327/437
[58] Field of Search .................................... 327/108, 109, 327/110, 111, 112, 333, 433, 436, 437, 374, 376, 377; 326/62, 80, 81

[56] References Cited

U.S. PATENT DOCUMENTS

| 5,266,848 | 11/1993 | Nakagome et al. | 327/306 |
| 5,650,742 | 7/1997 | Hirano | 327/333 |
| 5,729,165 | 3/1998 | Lou et al. | 327/112 |
| 5,789,942 | 8/1998 | Mizuno | 326/81 |

*Primary Examiner*—Kenneth B. Wells
*Assistant Examiner*—Hai L. Nguyen
*Attorney, Agent, or Firm*—Rader, Fishman & Grauer; Ronald P. Kananen

[57] ABSTRACT

A level shift circuit for receiving an input signal with a first level and a second level that is lower than the first level, and supplying an output signal with a third level and a fourth level, the third level being equal to or higher than the first level, the fourth level being equal to or lower than the second level comprises a high level power supply for supplying a voltage with the third level, a low level power supply for supplying a voltage with the fourth level, an inverter circuit whose input terminal is connected to a supply line of the input signal, a first transistor for connecting an output node thereof to the high level power supply when the output level of the inverter circuit substantially becomes the second level or below, a second transistor for connecting an output node thereof to the low level power supply when the output level of the inverter circuit substantially becomes the first level or above, a third transistor for causing the first transistor to be kept in an non-conductive state when the level of the output node substantially becomes the second level or below, a fourth transistor for causing the second transistor to be kept in an non-conductive state when the level of the output node substantially becomes the first level or above, a fifth transistor connected between the third transistor and the high level power supply, and a sixth transistor connected between the fourth transistor and the low level power supply.

2 Claims, 6 Drawing Sheets

ID=5,912,577

LEVEL SHIFT CIRCUIT

BACKGROUND OF THE INVENTION

1. Field of the Invention

The present invention relates to a level shift circuit for converting a level of an input signal into another level.

2. Description of the Related Art

FIG. 1 is a schematic diagram showing a level shift circuit for use with a semiconductor apparatus such as a flash memory. The level shift circuit converts the level of a power supply voltage ($V_{cc}$) and a ground power supply voltage (GND) of an input signal into the level of a high positive voltage (PV) level or a high negative voltage (MV) level. Referring to FIG. 1, the conventional level shift circuit comprises an inverter INV 101, p-channel MOS transistors PT 101 to PT 104, and n-channel MOS transistors NT 101 to NT 104.

The drain of the p-channel MOS transistors PT 101 and the drain of the n-channel MOS transistors NT 101 are connected. The connected point is a node ND 101. The node ND 101 is connected to the gate of the p-channel MOS transistor PT 102 and the gate of the p-channel MOS transistor PT 103.

Likewise, the drain of the p-channel MOS transistor PT 102 and the drain of the n-channel MOS transistor NT 102 are connected. The connected point is a node ND 102. The node ND 102 is connected to the gate of the p-channel MOS transistor PT 101 and the gate of the p-channel MOS transistor PT 104.

The drain of the p-channel MOS transistor PT 103 and the drain of the n-channel MOS transistor NT 103 are connected. The connected point is a node ND 103. The node ND 103 is connected to the gate of the n-channel MOS transistor NT 104. Likewise, the drain of the p-channel MOS transistor PT 104 and the drain of the n-channel MOS transistor NT 104 are connected. The connected point is an output node $ND_{OUT}$. The output node $ND_{OUT}$ is connected to the gate of the n-channel MOS transistor NT 103.

The sources of the p-channel MOS transistors PT 101 to PT 104 are connected to a power supply that supplies a high positive voltage PV ($\geq V_{cc}$). The n-channel MOS transistors NT 101 and NT 102 are connected to a power supply that supplies a GND voltage. The sources of the n-channel MOS transistors NT 103 and NT 104 are connected to a power supply that supplies a high negative voltage MV ($\leq$GND).

The gate of the n-channel MOS transistor NT 101 is connected to an input line of an input signal IN. The gate of the n-channel MOS transistor NT 102 is connected to the input line of the input signal IN through the inverter INV 101. The inverter INV 101 is connected between the power supply that supplies the voltage $V_{cc}$ and the power supply that supplies the voltage GND. The output node $ND_{OUT}$ is connected to an output line of an output signal OUT.

The p-channel MOS transistors PT 101 to PT 104 and the n-channel MOS transistors NT 101 to NT 104 of the conventional level shift circuit are disposed in respective wells. In this case, the p-channel MOS transistors PT 101 to PT 104 are disposed in an n-type well. The n-type well is biased in a PV level. The n-channel MOS transistors NT 101 to NT 104 are disposed in a p-type well. The p-type well is biased in an MV level.

The conventional level shift circuit converts an input signal with the $V_{cc}$ level or the GND level into an output signal with the MV level or the PV level. Next, the operation of the level shift circuit in the case that the voltage of the input signal IN is varied from the $V_{cc}$ level (high level) to the GND level (low level) will be described.

In other words, when a signal with the $V_{cc}$ level is input as the input signal IN, the n-channel MOS transistor NT 101 is turned on. In addition, the n-channel MOS transistor NT 102 is turned off. Thus, the voltage of the node ND 101 becomes the GND level. Consequently, both the p-channel MOS transistors PT 102 and PT 103 are turned on. Since the p-channel MOS transistor PT 102 is in the on-state, the voltage of the node ND 102 rises to the PV level. The p-channel MOS transistor PT 101 is stably kept in the off-state. Thus, the voltage of the node ND 101 is stably kept in the GND level. The p-channel MOS transistors PT 102 and PT 103 are stably kept in the on-state.

Since the voltage of the node ND 102 is in the PV level, the p-channel MOS transistor PT 104 is turned off. In addition, since the p-channel MOS transistor PT 103 is in the on-state, the voltage of the node ND 103 rises to the PV level. Thus, the n-channel MOS transistor NT 104 is turned on. The voltage of the output node $ND_{OUT}$ lowers to the MV level.

Since the voltage of the output node $ND_{OUT}$ is in the MV level, the n-channel MOS transistor NT 103 is stably kept in the off-state. Thus, the voltage of the output node $ND_{OUT}$ is settled in the MV level. Consequently, the output node $ND_{OUT}$ outputs an output signal OUT with the MV level.

When the voltage of the input signal IN is varied from the $V_{cc}$ level to the GND level, the n-channel MOS transistor NT 102 is turned on. In addition, the n-channel MOS transistor NT 101 is turned off. Thus, the voltage of the node ND 102 becomes the GND level. The p-channel MOS transistors PT 101 and PT 104 are turned on. Since the p-channel MOS transistor PT 101 is in the on-state, the voltage of the node ND 101 rises to the PV level. Thus, the p-channel MOS transistors PT 102 and PT 103 are turned off and stably kept in the off-state.

Since the p-channel MOS transistor PT 104 is in the on-state, the voltage of the output node $ND_{OUT}$ rises to the PV level. Thus, the n-channel MOS transistor NT 103 is turned on. Consequently, the voltage of the node ND 103 lowers to the MV level. The n-channel MOS transistor NT 104 is stably kept in the off-state. The voltage of the output node $ND_{OUT}$ is settled in the PV level. Thus, the output node $ND_{OUT}$ outputs an output signal OUT with the PV level.

FIG. 2 is a schematic diagram showing another example of a conventional level shift circuit. Referring to FIG. 2, the level shift circuit comprises an inverter INV 201, p-channel MOS transistors PT 201 to PT 203, and n-channel MOS transistors NT 201 to NT 203.

The inverter INV 201 is connected between a power supply that supplies a voltage $V_{cc}$ and a power supply that supplies a voltage GND. An input terminal of the inverter INV 201 is connected to a supply line of an input signal IN. An output terminal of the inverter INV 201 is connected to the drain of the p-channel MOS transistor PT 202 and the gate of the p-channel MOS transistor PT 203 through the n-channel MOS transistor NT 201 whose gate is connected to the power supply that supplies the $V_{cc}$ voltage. In addition, the output terminal of the inverter INV 201 is connected to the drain of the n-channel MOS transistor NT 202 and the gate of the n-channel MOS transistor NT 203 through the p-channel MOS transistor PT 201 whose gate is connected to the power supply that supplies the GND voltage.

The threshold voltages of the n-channel MOS transistor NT 201 and the p-channel MOS transistor PT 201 are lower than the threshold voltages of the other transistors. Thus, the n-channel MOS transistor NT 201 and the p-channel MOS transistor PT 201 function as cut gates. In FIG. 2, reference codes ND 201 and ND 202 represent nodes. The node ND 201 is a connected point between the drain of the p-channel MOS transistor PT 202 and the gate of the p-channel MOS transistor PT 203. The node ND 202 is a connected point between the drain of the n-channel MOS transistor NT 202 and the gate of the n-channel MOS transistor NT 203.

The source of the p-channel MOS transistor PT 202 and the source of the p-channel MOS transistor PT 203 are connected to a power supply that supplies a high positive voltage PV ($\geq V_{cc}$). The source of the n-channel MOS transistor NT 202 and the source of the n-channel MOS transistor NT 203 are connected to a power supply that supplies a high negative voltage MV ($\leq$ GND).

The drain of the p-channel MOS transistor PT 203 and the drain of the n-channel MOS transistor NT 203 are connected. The connected point is an output node $ND_{OUT}$. The output node $ND_{OUT}$ is connected to the gate of the p-channel MOS transistor PT 202. In addition, the output node $ND_{OUT}$ is connected to the gate of the n-channel MOS transistor NT 202. The output node $ND_{OUT}$ is connected to an output line of an output signal OUT.

In the level shift circuit, the p-channel MOS transistors PT 201 to PT 203 and the n-channel MOS transistors NT 201 to NT 203 are disposed in respective wells. In this case, the p-channel MOS transistors PT 201 to PT 203 are disposed in an n-type well. The n-type well is biased in the PV level. The n-channel MOS transistors NT 201 to NT 203 are disposed in a p-type well. The p-type well is biased in the MV level.

The conventional level shift circuit converts an input signal with the $V_{cc}$ level or the GND level into an output signal OUT with the PV level or the MV level. Next, the operation of the level shift circuit in the case that the voltage of the input signal IN is varied from the $V_{cc}$ level (high level) to the GND level (low level) will be described.

In other words, since the inverter INV 201 in the conventional level shift circuit inverts the level of the input signal IN, the input signal IN with the $V_{cc}$ level causes the voltage of the output terminal of the inverter INV 201 to become the GND level. The signal with the GND level is supplied to the node ND 201 through the n-channel MOS transistor NT 201. Thus, the signal with the GND level is supplied to the gate of the p-channel MOS transistor PT 203. In addition, the signal with the GND level is supplied to the node ND 202 through the p-channel MOS transistor PT 201. Thus, the signal with the GND level is supplied to the gate of the n-channel MOS transistor NT 203.

Consequently, the p-channel MOS transistor PT 203 is turned on. In addition, the n-channel MOS transistor NT 203 is turned off. Thus, the voltage of the output node $ND_{OUT}$ rises to the PV level. As a result, the p-channel MOS transistor PT 202 is stably kept in the off-state. The n-channel MOS transistor NT 202 is stably kept in the on-state. Thus, the voltage of the node ND 202 lowers to the MV level. Consequently, the n-channel MOS transistor NT 203 is stably kept in the off-state. Thus, the voltage of the output node $ND_{OUT}$ is settled in the PV level. At this point, the p-channel MOS transistor PT 201 becomes the cut-off state.

Thus, at this point, the output node $ND_{OUT}$ outputs an output signal OUT with the PV level.

When the voltage of the input signal IN varies from the $V_{cc}$ level to the GND level, the inverter INV 201 and the n-channel MOS transistor NT 201 cause the voltage of the node ND 201 to rise to $V_{cc}-V_{th}$ level (where $V_{th}$ is the threshold voltage of the n-channel MOS transistor NT 201). In addition, the inverter INV 201 and the p-channel MOS transistor PT 201 causes the voltage of the node ND 202 to rise to the $V_{cc}$ level. Thus, the p-channel MOS transistor PT 203 is turned off. In addition, the n-channel MOS transistor NT 203 is turned on. Consequently, the voltage of the output node $ND_{OUT}$ lowers to the MV level. Thus, the p-channel MOS transistor PT 202 is stably kept in the on-state. In addition, the n-channel MOS transistor NT 202 is stably kept in the off-state. Consequently, the voltage of the node ND 201 rises to the PV level. Thus, the p-channel MOS transistor PT 203 is stably kept in the off-state. Consequently, the voltage of the output node $ND_{OUT}$ is settled in the MV level. At this point, the n-channel MOS transistor NT 201 becomes the cut-off state.

Thus, at this point, the output node $ND_{OUT}$ outputs an output signal with the MV level.

This operation applies to the case that the voltage of the input signal IN is varied from the GND level to the $V_{cc}$ level. In this case, the p-channel MOS transistors PT 201 to PT 203 and the n-channel MOS transistors NT 201 to NT 203 operate in the inverse manner of the above-described operation.

However, in the level shift circuit shown in FIG. 1, when the input signal IN with GND level–$V_{cc}$ level is converted into the output signal OUT with PV level–MV level, after the signal with GND level–$V_{cc}$ level is converted into the signal with GND level–PV level in a first stage, the signal with GND level–PV level is converted into the signal with MV level–PV level in a second stage. Thus, the layout area becomes large.

Since the level shift circuit shown in FIG. 2 is a one-staged level shift circuit and the number of transistors thereof is as small as six, the layout thereof is very easy. However, the level shift circuit shown in FIG. 2 requires cut-off gates (namely, the p-channel MOS transistor PT 201 and the n-channel MOS transistor NT 201). Unless the cut gates are composed of transistors with low threshold voltages, the following problem will take place.

An operational simulation for the conventional level shift circuit shown in FIG. 2 shows the following point. In the level shift circuit used in the operational simulation, transistors with normal threshold voltages were used for the p-channel MOS transistor PT 201 and n-channel MOS transistor NT 201 that compose the cut gates. In addition, since a two-staged inverter is used in the input stage, the voltage of the output signal OUT corresponding to the voltage of the input signal IN is the inverse of that of the circuit shown in FIG. 2.

FIG. 3 is a graph showing the result of the operational simulation of the conventional level shift circuit. FIG. 3 shows simulated results of transient response characteristics in the condition that the input signal IN is varies from the GND level to the $V_{cc}$ level and that $V_{cc}$ level=2.5 V, GND level=0 V, PV level=3.5 V, and MV level=−1.5 V. In the graph shown in FIG. 3, the horizontal axis is a time axis (in nsec), whereas the vertical axis is a voltage axis (in V). In addition, solid lines and white dots represent the input signal IN, whereas dashed lines and black dots represent the output signal OUT.

As shown in FIG. 3, in the conventional level shift circuit, the input signal IN with voltages of 0 V and 2.5 V is converted into the output signal with voltages of 3.5 and −1.5 V. However, when the level of the output signal OUT is inverted corresponding to the input signal IN, the transient characteristics deteriorate. In addition, it takes a relatively long time until the output signal OUT becomes stable. When such a simulation was performed with a large potential (namely, PV level=5 V and MV level=−3 V), the conventional level shift circuit did not operate.

Thus, in the conventional level shift circuit shown in FIG. 2, unless cut gates composed of transistors with low threshold voltages are used, the inverting operation of an output signal OUT cannot be performed at high speed. In addition, an output signal with a large amplitude cannot be output.

Moreover, when the conventional level shift circuit shown in FIG. 2 operates, a large through-current flows in the circuit. For example, when the voltage of the input signal IN is varied from the $V_{cc}$ level to the GND level and thereby the voltage of the output signal is inverted from the PV level to the MV level, although the voltage of the node ND 202 is tried to be raised from the MV level to the $V_{cc}$ level, since the n-channel MOS transistor NT 202 is in the on-state, a large through-current flows through the n-channel MOS transistor NT 202. The through-current prevents the voltage of the node ND 202 from smoothly varying. Thus, the inverting operation of the output signal OUT cannot be performed at high speed. When the potential between the PV level and the MV level is large, the output signal OUT can be inverted.

OBJECTS AND SUMMARY OF THE INVENTION

An object of the present invention is to provide a level shift circuit that allows the layout area and the through-current that flows in the circuit to decrease, the amplitude of a signal whose level has been converted to increase, and the level converting operation to be performed at high speed.

To accomplish the above-described object, the present invention is a level shift circuit for receiving an input signal with a first level and a second level that is lower than the first level, and supplying an output signal with a third level and a fourth level, the third level being equal to or higher than the first level, the fourth level being equal to or lower than the second level, comprising a high level power supply (PV) for supplying a voltage with the third level, a low level power supply (MV) for supplying a voltage with the fourth level, an inverter circuit (INV 1) whose input terminal is connected to a supply line of the input signal (IN), a first transistor (PT 3) for connecting an output node (ND$_{OUT}$) thereof to the high level power supply when the output level of the inverter circuit substantially becomes the second level or below, a second transistor (NT3) for connecting an output node thereof to the low level power supply when the output level of the inverter circuit substantially becomes the first level or above, a third transistor (PT 2) for causing the first transistor to be kept in an non-conductive state when the level of the output node substantially becomes the second level or below, a fourth transistor (NT 2) for causing the second transistor to be kept in an non-conductive state when the level of the output node substantially becomes the first level or above, a fifth transistor (PT 4) connected between the third transistor and the high level power supply, and a sixth transistor (NT 4) connected between the fourth transistor and the low level power supply, wherein the conductive states of the fifth transistor and the sixth transistor are controlled with a signal in an inverted level of the output level of the inverter circuit.

In the level shift circuit of the present invention, a seventh transistor (NT 1) is connected between a first connected point of the gate of the first transistor and the drain of the third transistor and the output terminal of the inverter circuit, the gate of the seventh transistor being connected to a power supply for the first level, the seventh transistor cutting off when the voltage of the first connected point becomes higher than the first level. In addition, an eighth transistor (PT 1) is connected between a second connected point of the gate of the second transistor and the drain of the fourth transistor and the output terminal of the inverter circuit, the gate of the eighth transistor being connected to a power supply for the second level, the eighth transistor cutting off when the voltage of the second connected point becomes lower than the second level.

According to the level shift circuit of the present invention, the operation for converting an input signal with a first level and a second level (that is lower than the first level) into a signal with a third level (that is equal to or higher than the first level) and a fourth level (that is equal to or lower than the second level) can be performed with a one-staged circuit. Thus, the layout area of the circuit can be reduced.

A fifth transistor is connected between the third transistor and the high level power supply. A sixth transistor is connected between the fourth transistor and the low level power supply. The conductive states of the fifth transistor and the sixth transistor are controlled with a signal in an inverted level of the output level of the inverter circuit. Thus, when the voltage of the output node is inverted from the third level to the fourth level, the resistance of the sixth transistor becomes high, thereby suppressing a through-current that flows in the fourth transistor and the sixth transistor. When the voltage of the output node is inverted from the fourth level to the third level, the resistance of the fifth transistor becomes high, thereby suppressing a through-current that flows in the third transistor and the fifth transistor.

In addition, as the seventh transistor and the eighth transistor as cut-off gates, with transistors having normal threshold voltages (in other words, without need to use transistors having low threshold voltages as the seventh transistor and the eighth transistor), even if the potential between the third level and the fourth level is large, the level converting operation can be performed at high speed.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENTS

Next, with reference to the accompanying drawings, an embodiment of the present invention will be described. FIG.

4 is a schematic diagram showing an example of the structure of a level shift circuit according to an embodiment of the present invention. The level shift circuit is used for a semiconductor apparatus such as a flash memory so as to convert an input signal with a power supply voltage ($V_{cc}$) and a ground voltage (GND) into an output signal with a high positive voltage (PV) or a high negative voltage (MV).

Figure 4:
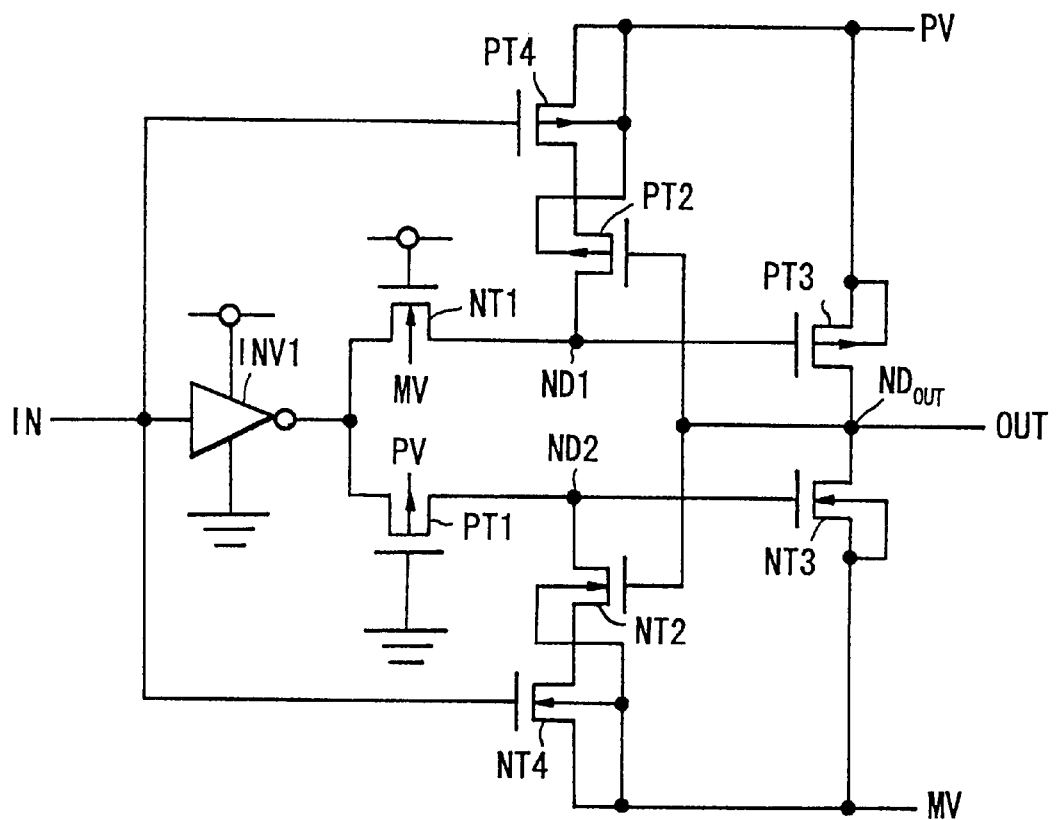
FIG. 4 is a schematic diagram showing an example of the structure of a level shift circuit according to an embodiment of the present invention.

Referring to FIG. 4, the level shift circuit comprises an inverter INV 1, p-channel MOS transistors PT 1 to PT 4, and n-channel MOS transistors NT 1 to NT 4.

The inverter INV 1 is connected between a power supply that supplies a power supply voltage ($V_{cc}$) and a power supply that supplies a ground voltage (GND). An input terminal of the inverter INV 1 is connected to a supply line of an input signal IN. An output terminal of the inverter INV 1 is connected to the drain of the p-channel MOS transistor PT 2 and the gate of the p-channel MOS transistor PT 3 through the n-channel MOS transistor NT 1 whose gate is connected to the power supply that supplies the voltage $V_{cc}$. In addition, the output terminal of the inverter INV 1 is connected to the drain of the n-channel MOS transistor NT 2 and the gate of the n-channel MOS transistor NT 3 through the p-channel MOS transistor PT 1 whose gate is connected to the power supply that supplies the GND voltage.

The n-channel MOS transistor NT 1 and the p-channel MOS transistor PT 1 function as cut gates In this example, transistors with normal threshold voltages can be used as the n-channel MOS transistor NT 1 and the p-channel MOS transistor PT 1. Reference codes ND1 and ND2 represent nodes. A node ND 1 is a connected point between the drain of the p-channel MOS transistor PT 2 and the gate of the p-channel MOS transistor PT 3. A node ND 2 is a connected point between the drain of the n-channel MOS transistor NT 2 and the gate of the n-channel MOS transistor NT 3.

The source of the p-channel MOS transistor PT 2 is connected to the drain of the p-channel MOS transistor PT 4. The source of the n-channel MOS transistor NT 2 is connected to the drain of the n-channel MOS transistor NT 4. In this example, the gate of the p-channel MOS transistor PT 4 and the gate of the n-channel MOS transistor NT 4 are connected to a supply line of the input signal IN. In other words, the conductive states of the p-channel MOS transistor PT 4 and the n-channel MOS transistor NT 4 are controlled with the input signal IN that is the inverse of the output level of the inverter INV 1.

The source of the p-channel MOS transistor PT 3 and the source of the p-channel MOS transistor PT 4 are connected to the power supply that supplies the high positive voltage PV ($\geq V_{cc}$). The source of the n-channel MOS transistor NT 3 and the source of the n-channel MOS transistor NT 4 are connected to the power supply that supplies the high negative voltage MV ($\leq$ GND).

The drain of the p-channel MOS transistor PT 3 and the drain of the n-channel MOS transistor NT 3 are connected. The connected point is an output node $ND_{OUT}$. The output node $ND_{OUT}$ is connected to the gate of the p-channel MOS transistor PT 2. In addition, the output node $ND_{OUT}$ is connected to the gate of the n-channel MOS transistor NT 2. Moreover, the output node $ND_{OUT}$ is connected to the output line of the output signal OUT.

In the level shift circuit, the p-channel MOS transistor PT 4 is formed by inserting a wiring line (composed of polycide) of the gate of the p-channel MOS transistor PT 4 in a diffusion layer of the p-channel MOS transistor PT 2. Likewise, the n-channel MOS transistor NT 4 is formed by inserting a wiring line of the gate of the n-channel MOS transistor NT 4 in a diffusion layer of the n-channel MOS transistor NT 2.

In the level shift circuit, the p-channel MOS transistors PT 1 to PT 4 and the n-channel MOS transistors NT 1 to NT 4 are disposed in respective wells. In this example, the p-channel MOS transistors PT 1 to PT 4 are disposed in an n-type well. The n-type well is biased in the PV level. The n-channel MOS transistors NT 1 to NT 4 are disposed in a p-type well. The p-type well is biased in the MV level.

The level shift circuit converts the input signal IN with the $V_{cc}$ level or the GND level into an output signal with the PV level or the MV level. Next, the operation of the level shift circuit in the case that the voltage of the input signal IN is varied from the $V_{cc}$ level (high level) to the GND level (low level) will be described.

Since the inverter INV 1 in the level shift circuit inverts the level of the input signal IN, when a signal with the $V_{cc}$ level is supplied as the input signal IN, the voltage of the output terminal of the inverter INV 1 becomes the GND level. The signal with the GND level is supplied to the node ND 1 through the n-channel MOS transistor NT 1. Thus, the signal with the GND level is supplied to the gate of the p-channel MOS transistor PT 3. In addition, the signal with the GND level is supplied to the node ND 2 through the p-channel MOS transistor PT 1. Thus, the signal with the GND level is supplied to the gate of the n-channel MOS transistor NT 3.

Thus, the p-channel MOS transistor PT 3 is turned on. In addition, the n-channel MOS transistor NT 3 is turned off. Consequently, the voltage of the output node $ND_{OUT}$ rises to the PV level. Thus, the p-channel MOS transistor PT 2 is stably kept in the off-state. In addition, the n-channel MOS transistor NT 2 is stably kept in the on-state.

Since the input signal IN with the $V_{cc}$ level is supplied to the gate of the p-channel MOS transistor PT 4 and the gate of the n-channel MOS transistor NT 4, the p-channel MOS transistor PT 4 is turned off and the n-channel MOS transistor NT 4 is turned on. In addition, since the n-channel MOS transistor NT 2 is in the on-state, the voltage of the node ND 2 lowers from the GND level to the MV level. Thus, the n-channel MOS transistor NT 3 is stably kept in the off-state. The voltage of the output node $ND_{OUT}$ is settled in the PV level. At this point, the p-channel MOS transistor PT 1 becomes the cut-off state. At this point, since the n-channel MOS transistor NT 3 is in the off-state, a through-current does not flow between the p-channel MOS transistor PT 3 and the n-channel MOS transistor NT 3.

Thus, at this point, the output node $ND_{OUT}$ outputs an output signal OUT with the PV level.

Next, when the level of the input signal IN is varied from the $V_{cc}$ level to the GND level, a signal with the GND level is supplied to the gate of the n-channel MOS transistor NT 4 and the gate of the p-channel MOS transistor PT 4. Thus, the resistance of the n-channel MOS transistor NT 4 increases, thereby turning on the p-channel MOS transistor PT 4. The input signal IN with the GND level is supplied to the node ND 1 through the inverter INV 1 and the n-channel MOS transistor NT 1. Thus, the level of the node ND 1 rises from the GND level to $V_{cc}-V_{th}$ level (where $V_{th}$ is the threshold voltage of the n-channel MOS transistor NT 1). At this point, since the p-channel MOS transistor PT 2 is in the off-state, the voltage of the node ND 1 smoothly rises to $V_{cc}-V_{th}$ level.

Figure 2:
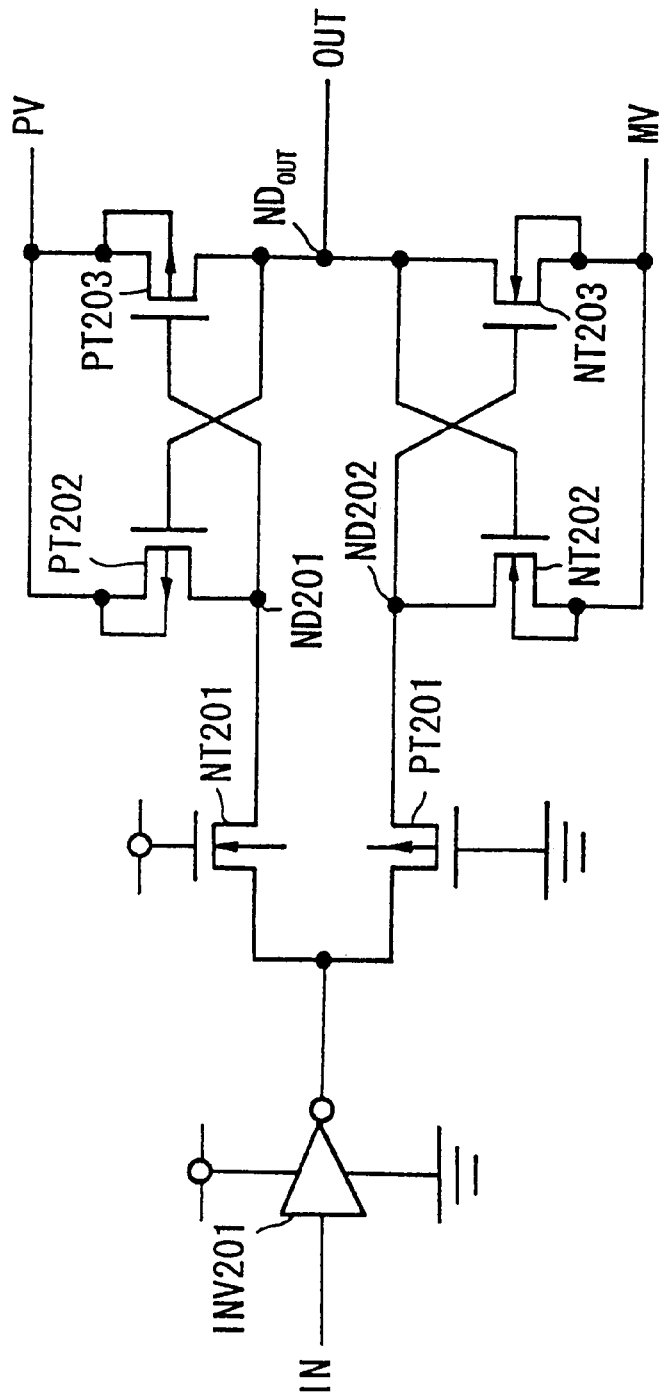
FIG. 2 is a circuit diagram showing a second example of the structure of a conventional level shift circuit.

In addition, since the input signal IN with the GND level is supplied to the node ND 2 through the inverter INV 1 and the p-channel MOS transistor PT 1, the voltage of the node ND 2 is tried to be raised from the MV level to the $V_{cc}$ level. Unlike with the conventional level shift circuit shown in FIG. 2, in the level shift circuit according to the embodiment, since the resistance of the n-channel MOS transistor NT 4 is large, the through-current that flows in the n-channel MOS transistors NT 2 and NT 4 is suppressed. Thus, the voltage of the node ND 2 smoothly rises from the MV level to the $V_{cc}$ level.

The size ratio of the p-channel MOS transistor PT 3 and the n-channel MOS transistor NT 3 is adjusted so that $V_{cc}-V_{th}$ level of the node ND 1 and the $V_{cc}$ level of the node ND 2 cause the level of the output node $ND_{OUT}$ to lower. Thus, the voltage of the output node $ND_{OUT}$ approaches the MV level. Consequently, the p-channel MOS transistor PT 2 is stably kept in the on-state. In addition, the n-channel MOS transistor NT 2 is stably kept in the off-state. As a result, the voltage of the node ND 1 rises to the PV level. Thus, since the through-current does not flow between the n-channel MOS transistors NT 2 and NT 4, the voltage of the node ND 2 becomes the $V_{cc}$ level. Consequently, the p-channel MOS transistor PT 3 is stably kept in the off-state. The voltage of the output node $ND_{OUT}$ is settled in the MV level. At this point, the n-channel MOS transistor NT 1 becomes the cut-off state. In addition, since the p-channel MOS transistor PT 3 is in the off-state, a through-current does not flow between the p-channel MOS transistor PT 3 and the n-channel MOS transistor NT 3.

Thus, at this point, the output node $ND_{OUT}$ outputs an output signal OUT with the MV level.

The above-described operation applies to the case that the voltage of the input signal IN is varied from the GND level to the $V_{cc}$ level. In this case, the p-channel MOS transistors PT 1 to PT 4 and the n-channel MOS transistors NT 1 to NT 4 operate in the inverse manner of the above-described operation.

Figure 3:
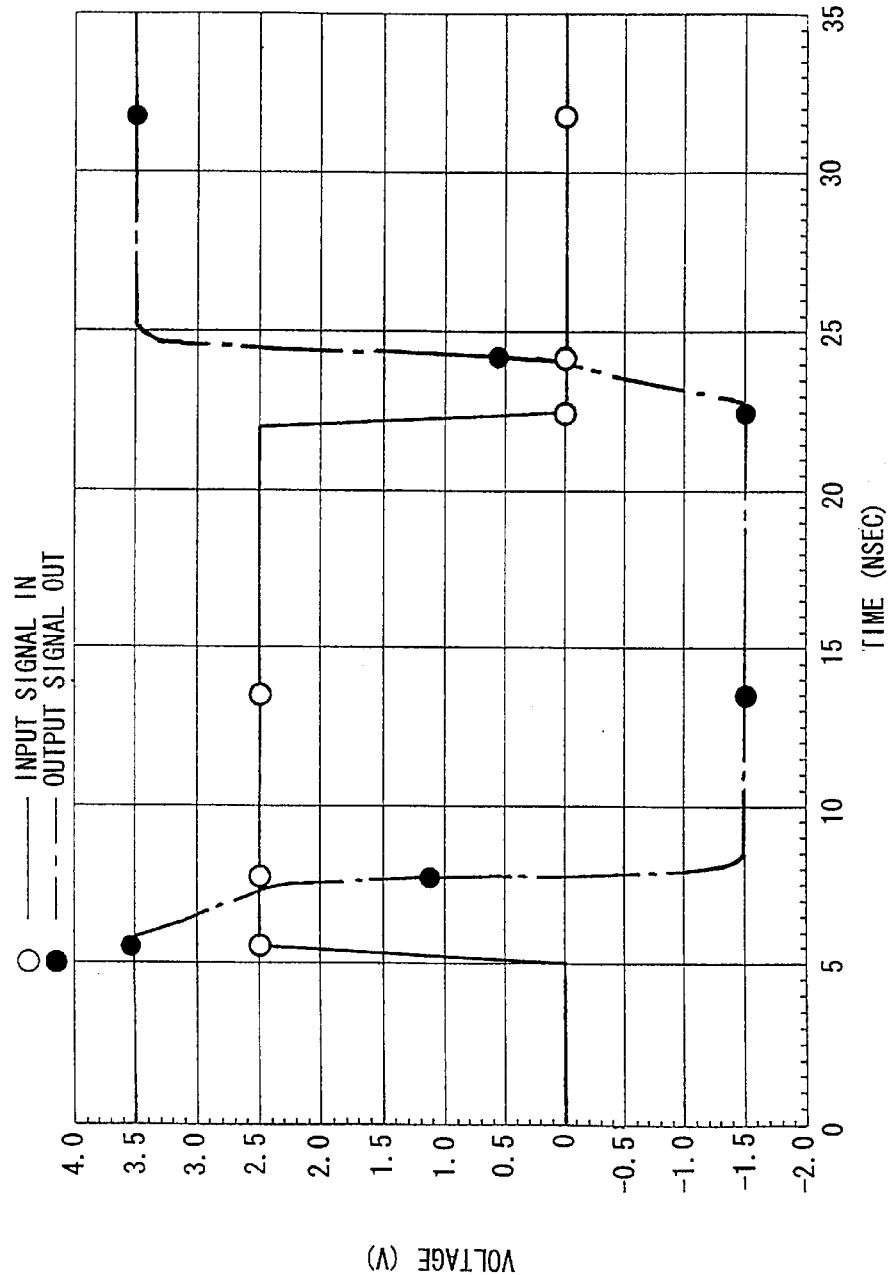
FIG. 3 is a graph showing the result of an operational simulation of a conventional level shift circuit.

An operational simulation for the level shift circuit according to the embodiment was performed. In the level shift circuit used in the operational simulation, as the p-channel MOS transistor PT 1 and the n-channel MOS transistor NT 1 that are cut gates, transistors with normal threshold voltages were used. In addition, since a two-staged inverter circuit was used in the input stage, the voltage of the output signal OUT corresponding to the input signal IN is the inverse of the voltage of the circuit shown in FIG. 4. In the operational simulation, for comparison, transistors that are the same as those of the conventional level shift circuit used in the operational simulation shown in FIG. 3 were used.

Figure 5:
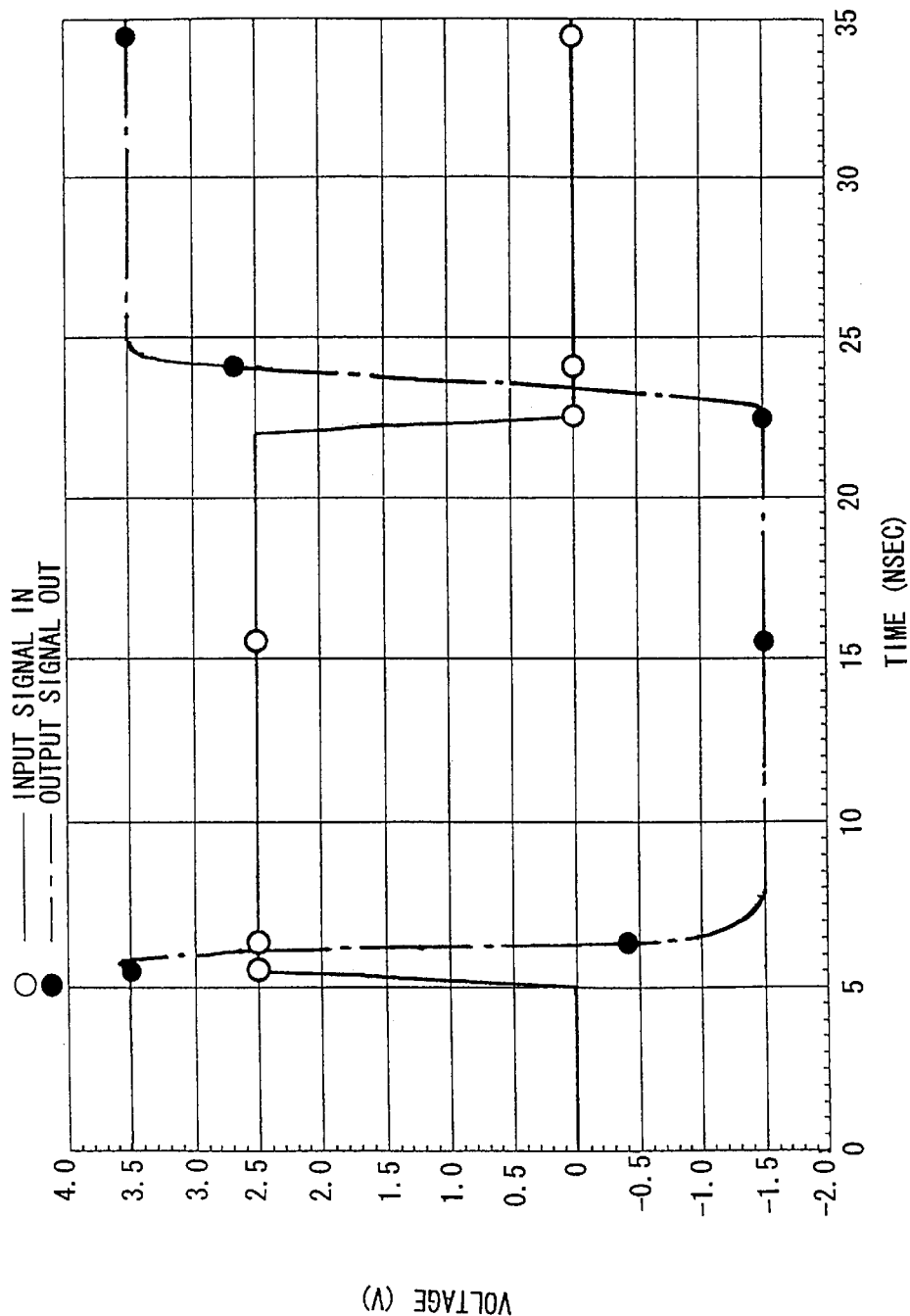
FIG. 5 is a graph showing the result of an operational simulation of the level shift circuit according to the embodiment of the present invention.
Figure 6:
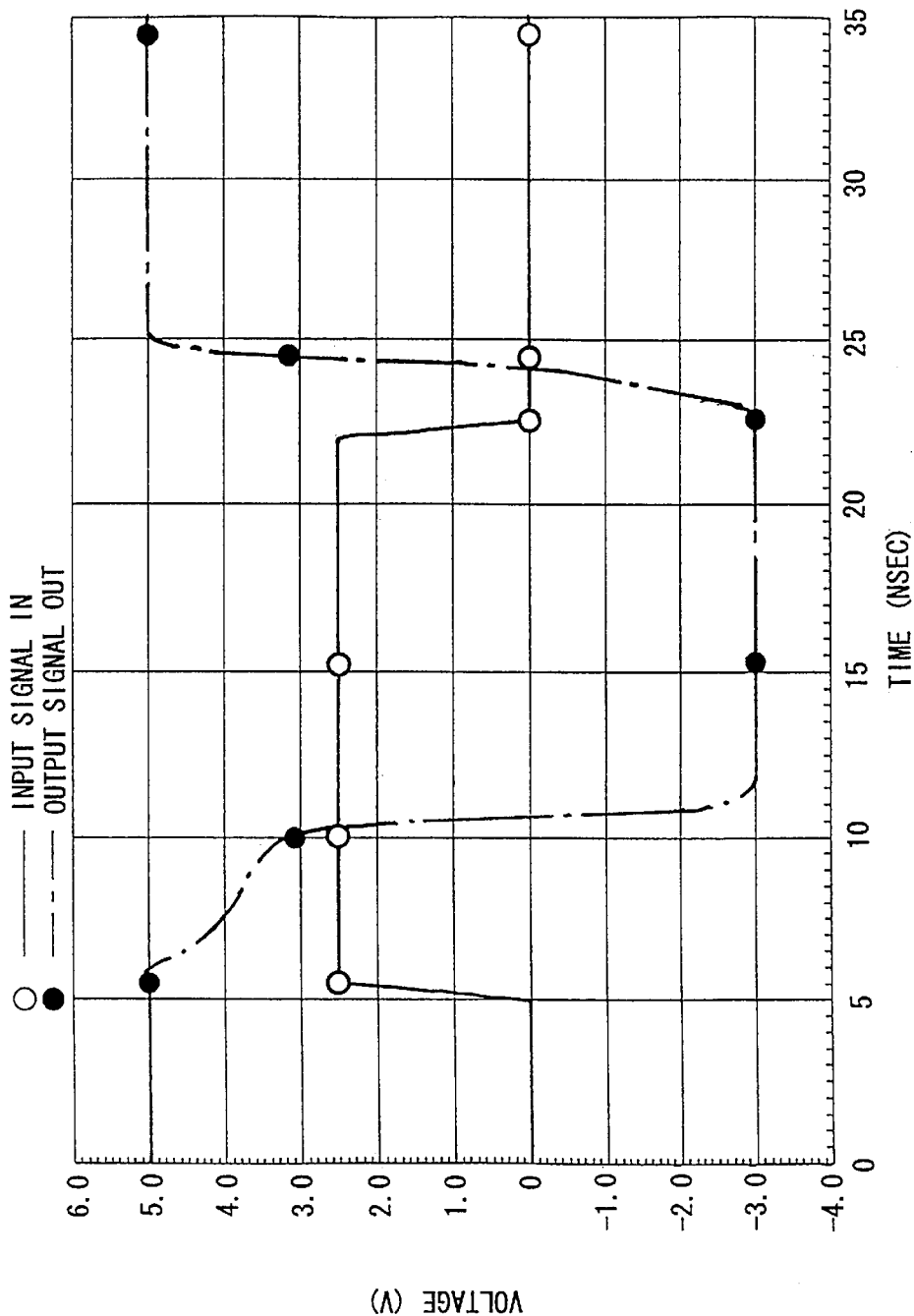
FIG. 6 is a graph showing the result of an operational simulation of the level shift circuit according to the embodiment of the present invention.

FIGS. 5 and 6 are graphs showing simulated results of the level shift circuit according to the embodiment of the present invention. FIGS. 5 and 6 show simulated results of transient response characteristics in the case that the input signal IN was varied between the GND level and the $V_{cc}$ level. FIG. 5 shows a simulated result in the conditions that $V_{cc}$ level=2.5 V, GND level=0 V, PV level=3.5, and MV level=–1.5 V. FIG. 6 shows a simulated result in the conditions that $V_{cc}$ level=2.5 V, GND level=0 V, PV level=5.0 V, and VM level=–3.0 V. In the graphs shown in FIGS. 5 and 6, the horizontal axis is a time axis (in nsec), whereas the vertical axis is a voltage axis (in V). Solid lines and white dots represent the input signal. Dashed lines and black dots represent the output signal.

As shown in FIG. 5, when the input signal IN with levels of 0 V and 2.5 V is converted into the output signal with levels of 3.5 and –1.5 V, the transient characteristics in the case that the output signal OUT is inversed corresponding to the input signal IN are excellent. In addition, it takes a relatively short time until the output signal OUT becomes stable. As is clear from the comparison of the simulated result of the level shift circuit according to the embodiment with the simulated result of the conventional level shift circuit shown in FIG. 3, the inverting operation of the output signal OUT of the level shift circuit according to the embodiment can be performed more quickly than that of the conventional level shift circuit.

When the potential between the PV level and the MV level is large, the conventional level shift circuit does not operate. However, as shown in FIG. 6, the voltage of the output signal OUT can be inverted even in the conditions that PV level=5.0 V and MV level=–3.0 V.

Figure 1:
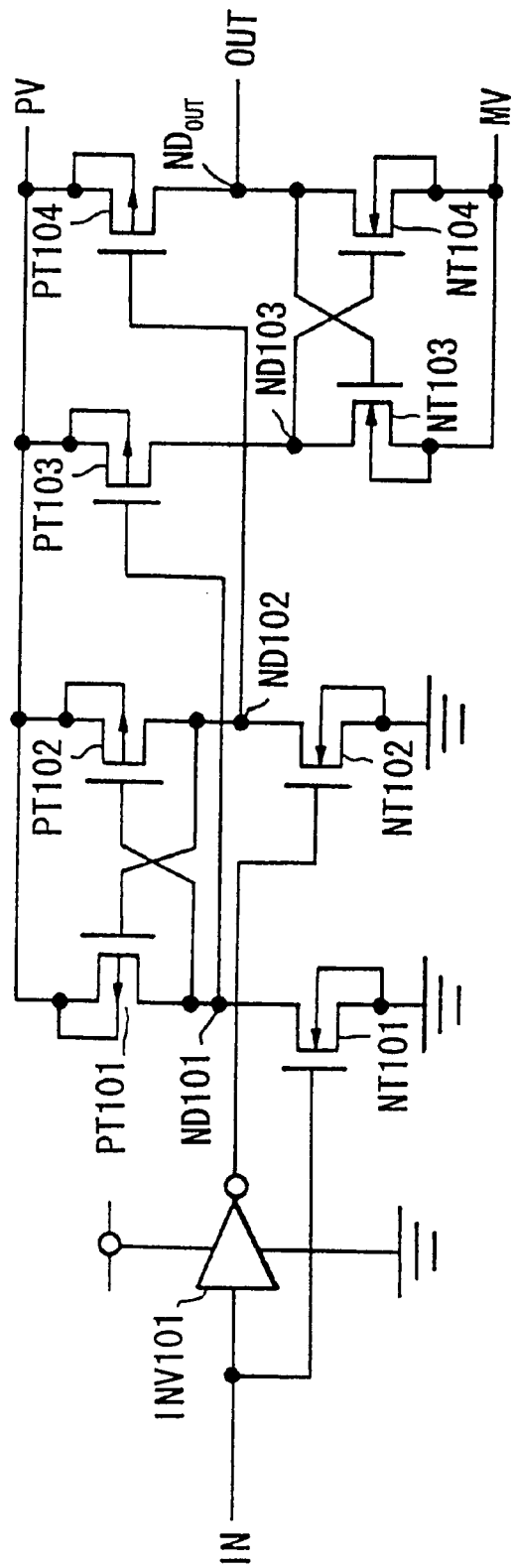
FIG. 1 is a circuit diagram showing a first example of the structure of a conventional level shift circuit.

As describe above, according to the level shift circuit of the embodiment of the present invention, the input signal IN with GND level–$V_{cc}$ level is converted into the output signal with MV level–PV level by a one-staged circuit. Thus, the layout area of the level shift circuit according to the embodiment can be decreased in comparison with the conventional level shift circuit that performs such a level conversion with a two-staged circuit shown in FIG. 1. In addition, according to the level shift circuit of the embodiment, only the p-channel MOS transistor PT 4 and the n-channel MOS transistor NT 4 are added in comparison with the conventional level shift circuit that performs such a level conversion with a one-staged circuit shown in FIG. 2. Moreover, actually, since only two wiring lines are added as the gate of the p-channel MOS transistor PT 4 and the gate of the n-channel MOS transistor NT 4, the layout area does not almost increase.

In addition, since the conductive states of the p-channel MOS transistor PT 4 and the n-channel MOS transistor NT 4 are controlled with a signal in an inverted level of the output level of the inverter INV (namely, the input signal IN), when the level of the input signal IN is varied and thereby the output signal OUT is inverted, a through-current that flows in the level shift circuit can be reduced in comparison with the conventional level shift circuit.

Moreover, without need to use transistors having low threshold voltages as the p-channel MOS transistor PT 1 and the n-channel MOS transistor NT 1 that function as cut gates, even if the potential between the PV level and the MV level is relatively large, the output signal OUT can be inverted at high speed. Thus, the input signal IN can be converted into the output signal OUT with a large amplitude.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention. It should be noted that the structures and numeric values in the embodiment are only examples. Thus, the present invention is not limited to such an embodiment.

In addition, as the p-channel MOS transistor PT 1 and the n-channel MOS transistor NT 1 that function as cut gates, transistors with low threshold voltages can be used.

As described above, according to the present invention, a level shift circuit that allows the layout area and the through-current that flows in the circuit to decrease, the amplitude of the output signal that has been level-shifted to increase, and the level converting operation to be performed at high speed can be provided.

What is claimed is:

1. A level shift circuit for receiving an input signal with a first level and a second level that is lower than said first level, and supplying an output signal with a third level and a fourth level, the third level being equal to or higher than said first level, the fourth level being equal to or lower than said second level, comprising:

a high level power supply for supplying a voltage with said third level;

a low level power supply for supplying a voltage with said fourth level;

an inverter circuit whose input terminal is connected to a supply line of said input signal;

a first transistor for connecting an output node to said high level power supply when the output level of said inverter circuit substantially becomes the second level or below;

a second transistor for connecting said output node to said low level power supply when the output level of said inverter circuit substantially becomes the first level or above;

a third transistor for causing said first transistor to be kept in an non-conductive state when the level of said output node substantially becomes the second level or below;

a fourth transistor for causing said second transistor to be kept in an non-conductive state when the level of the output node substantially becomes the first level or above;

a fifth transistor connected between said third transistor and said high level power supply; and a sixth transistor connected between said fourth transistor and said low level power supply, wherein the conductive states of said fifth transistor and said sixth transistor are controlled by said input signal.

2. The level shift circuit as set forth in claim 1, wherein a seventh transistor is connected between a first connected point of the gate of said first transistor and a drain of the third transistor and the output terminal of said inverter circuit, the gate of the seventh transistor being connected to a power supply for said first level, the seventh transistor cutting off when the voltage of said first connected point becomes higher than said first level, wherein an eighth transistor is connected between a second connected point of the gate of said second transistor and the drain of said fourth transistor and the output terminal of said inverter circuit, the gate of the eighth transistor being connected to a power supply for said second level, said eighth transistor cutting off when the voltage of said second connected point becomes lower than said second level.

* * * * *